United States Patent [19]
Motoyama

[11] Patent Number: 5,621,246
[45] Date of Patent: Apr. 15, 1997

[54] SUBSTRATE FOR MOUNTING INTEGRATED CIRCUIT SEMICONDUCTOR CHIPS

[75] Inventor: Takushi Motoyama, Kawasaki, Japan

[73] Assignee: Fujitsu Limited, Kawasaki, Japan

[21] Appl. No.: 217,110

[22] Filed: Mar. 24, 1994

[30] Foreign Application Priority Data

Jul. 9, 1993 [JP] Japan ..................... 5-169461

[51] Int. Cl.⁶ .................................. H01L 23/48
[52] U.S. Cl. .................. 257/736; 257/739; 257/753; 257/784
[58] Field of Search .................. 257/723, 734, 257/739, 784, 736, 750, 753, 759

[56] References Cited

U.S. PATENT DOCUMENTS 5,309,025   5/1994   Bryant ..................... 257/774

FOREIGN PATENT DOCUMENTS 1-308036   12/1989   Japan ..................... 257/784
1-309340   12/1989   Japan ..................... 257/784
3-246945   11/1991   Japan ..................... 257/739

*Primary Examiner*—Sara W. Crane
*Assistant Examiner*—Roy Potter
*Attorney, Agent, or Firm*—Armstrong, Westerman, Hattori, McLeland & Naughton

[57] ABSTRACT

A multichip substrate including a bonding pad, wiring layers insulated by polyimide layers and structure for protecting separation or the polyimide layers from occurring due to water oozing from the polyimide layers by: fabricating posts between the bonding pad and an inorganic insulation layer fabricated on a base substrate through the organic insulation layers by accumulating parts of the wiring layers; and providing holes for setting the water free, around the bonding pad so that the polyimide layer is exposed out of the multichip substrate; or fabricating the bonding pad directly on the inorganic insulation layer, fabricating the polyimide layers and wiring layers in terraced configuration at a periphery of the bonding pad.

11 Claims, 9 Drawing Sheets

SUBSTRATE FOR MOUNTING INTEGRATED CIRCUIT SEMICONDUCTOR CHIPS

BACKGROUND OF THE INVENTION

Field of the Invention

The present invention relates to a substrate for mounting integrated circuit semiconductor chips (IC chips), and in particular, the present invention relates to a substrate including accumulated insulation layers made of organic substance.

At the present time, complying with needs of realizing high speeding and small sizing of electronic apparatus, large integration of a semiconductor circuit and miniaturization of a semiconductor device have been advanced as seen in a large scaled integrated circuit semiconductor device (LSI). However, not only the semiconductor device but also a substrate for mounting the semiconductor devices has been advanced. That is, the substrate has been advanced for miniaturizing wiring layers of the substrate, multiplying the wiring layers, decreasing a dielectric constant of an insulation layer in between the wiring layers and, in particular, mounting IC chips of the LSI directly on the substrate. The substrate for directly mounting the IC chips will be called "multichip substrate (MCS)" hereinafter.

In the MCS, an inorganic substance insulation layer, which will be simply called "inorganic insulation layer" hereinafter, made of inorganic substance such as silicon dioxide or alumina has been used as the most popular insulation layer. However, recently, an organic substance insulation layer, which will be called "organic insulation layer" hereinafter, made of organic substance such as polyimide begins to be used. An organic insulation layer made of polyimide, which will be simply called "polyimide layer" hereinafter, is the most typical organic insulation layer. Therefore, the polyimide layer will be discussed hereinafter, representing the organic insulation layer. Because of the general characteristics of organic substance, the polyimide layer is inferior to the inorganic insulation layer with regard to heat-resistance at high temperature. However, the polyimide layer is superior to the inorganic insulation layer with regard to a dielectric constant, flatness and optical sensitivity. The polyimide layer has small dielectric constant such as 3.5, high flatness and optical sensitivity. The optical sensitivity of the polyimide layer is as high as that of photoresist used in fabrication of semiconductor device.

Since the polyimide layer is laid between wiring layers of the MCS, the small dielectric constant of the polyimide layer contributes to decrease parasitic capacitance between the wiring layers. In other words, by virtue of the small dielectric constant of the polyimide layers, it becomes possible to fabricate a thin MCS including multi-wiring layers.

Since a predecessor of polyimide is liquid at room temperature, a very flat thin polyimide layer can be produced by well known spin-coating technique. The polyimide is manufactured by Asahikasei Incorporation (Japanese manufacturer), having a product name "TIMEL" Series G-7600, and 1-Methyl-2-Pyrrolidinon is a solution of the predecessor. By virtue of making the insulation layers very thin and flat, the MCS can be fabricated easily.

By virtue of the optical sensitivity of the polyimide layer, fabrication of multi-insulation layers is easy in comparison with a ease of using the inorganic insulation layers.

As described above, the polyimide layer is very useful for the MCS. However, the polyimide layer has a defect that accumulated multi-polyimide layers are separable when the heat process is carried out in fabrication of the MCS. The separation inherently arises due to water which has oozed out from the polyimide layer and stays on the surface of the polyimide layer in every heat process. This results in accelerating the separation of the accumulated polyimide layers. In particular, the separation occurs when the multi-polyimide layers are accumulated under a substance not passing water. Because, when the multi-polyimide layers are accumulated under the substance not passing water, the water oozed out from the polyimide layers is difficult to be set free to outside of the MCS. This results in lowering stickiness in between the accumulated multi-polyimide layers.

FIG. 1 is a partial cross sectional view of a prior art MCS (100) including multi-polyimide layers (51, 52, 53 and 54) accumulated on a silicon (Si) base substrate (7). FIG. 1 shows that the multi-polyimide layers 51, 52, 53 and 54 are fabricated under a metal pad (PAD) (2) consisting of a part of a wiring layer (34) and a protection film (40) fabricated on the part of the wiring layer 34. The protection film consists of a palladium (Pd) film (41) and a titanium (Ti) film (42). The multi-polyimide layers 51, 52, 53 and 54 are laid between wiring layers (31, 32, 33 and 34) made of aluminum (Al). A part of the wiring layer 34 forms the PAD 2 in a pad region 90. In the pad region 90 or under the PAD 2, no wiring layer lies except (the part of) the wiring layer 34, so that only polyimide layers 51, 52, 53 are accumulated between the PAD 2, which is formed by the part of the wiring layer 34, and a silicon dioxide ($SiO_2$) (62) insulation layer fabricated on the Si base substrate 7 through another $SiO_2$ insulation layer. The wiring layers 31, 32, 33 and a wiring layer (35) and another part of the wiring layer 34 are laid in a wiring region 13 with the polyimide layers 51, 52, 53 and 54. The $SiO_2$ insulation layer 61 is fabricated on the Si base substrate 7 and the $SiO_2$ insulation layer 62 is fabricated on the $SiO_2$ insulation layer 61, inserting a wiring layer 35 in the wiring region 13. The $SiO_2$ insulation layer 62 forms a capacitor between the wiring layers 31 and 35.

In FIG. 1, no wiring layer lies under the PAD 2. This is for avoiding the wiring layers 31, 32 and 33 from being damaged by force added to the PAD 2 when bonding wires, not depicted in FIG. 1, are bonded to the PAD 2.

In FIG. 1, the multi-polyimide layers 51 to 54 are not separated each other. However, since the multi-polyimide layers 51 to 54 are arranged under the PAD 2, there is a fear of arising the separation among the multi-polyimide layers 51 to 54 and between the wiring layer 34 and the polyimide layer 53. FIGS. 2A, 2B and 2C show a case where the polyimide layer 53 is separated from the wiring layer 34 under the PAD 2. FIGS. 2A, 2B and 2C show a part of the cross sectional view of the MCS 100 in FIG. 1, and in FIGS. 2A, 2B and 2C, the same reference numeral as in FIG. 1 designates the same part as in FIG. 1.

FIGS. 2A, 2B and 2C illustrate how the separation occurs in the MCS 100 due to the bonding force. FIG. 2A shows the cross sectional view before the bonding is carried out on the PAD 2. In FIG. 2A, no separation occurs in between the multi-polyimide layers 52, 53 and 54.

FIG. 2B illustrates the cross sectional view when bonding is carrying out by pushing the PAD 2 down with a bonding wire (8) made of gold. The pushing force is shown by an arrow (P) depicted by the bonding wire 8. In FIG. 2B, the PAD 2 is deformed by the pushing force P. However, by virtue of the pushing force P, no separation occurs among the multi-polyimide layers 52, 53 and 54 and between the PAD 2 and the polyimide layers 53.

Generally, a bonding wire is pulled every after bonding has been carried out to a metal pad, for ascertaining whether the bonding is carried out certainly. FIG. 2C illustrates the cross sectional view when the PAD 2 is pulled by the pulling force added through the bonding wire 8. The pulling force is illustrated by an arrow (P') depicted by the bonding wire 8. In FIG. 2C, the PAD 2 (the wiring layer 34) is separated from the polyimide layer 53, producing a gap (9) under the PAD 2. The separation is directly caused by the pulling force P' added to the PAD 2. However, the separation inherently arises due to water which has oozed out from the polyimide layer 53 and stays between the polyimide layer 53 and the PAD 2. The water cannot be set free to outside of the MCS 100 because of the PAD 2 which covers the polyimide layer 53. The water staying between the polyimide layer 53 and the PAD 2 accelerates the separation.

As described above, since the water is hard to be removed from the polyimide layers accumulated under the metal pad, the separation occasionally arises among the polyimide layers or between the wiring layer and the polyimide layer in the heat process of the MCS fabrication. As a result, it has been impossible to raise the production yield rate and the product reliability of the MCS, as far as the organic insulation layers such as the polyimide layers are used in the MCS. This has been a problem of the MCS in the prior art.

SUMMARY OF THE INVENTION

Therefore, an object of the present invention is to improve the structure of multi-polyimide layers accumulated under a metal pad of the MCS, so as not to arise the separation between the metal pad and the polyimide layer, among the multi-polyimide layers and between the polyimide layer and an inorganic insulation layer fabricated on a base substrate of the MCS, by the pushing and pulling force added to the metal pad in the bonding process.

Another object is to increase the production yield rate of the MCS including the multi-polyimide layers.

Still another object is to increase the product reliability of the MCS including the multi-polyimide layers.

In order to achieve the above objects, three kinds of improved structure, a first structure, a second structure and a third structure, are provided to the MCS.

According to the first structure, the above objects are accomplished by reinforcing the multi-polyimide layers, under the metal pad, so that no separation arises. The reinforcement is performed by standing structures like posts fabricated between the metal pad and the base substrate of the MCS, passing through the multi-polyimide layers so that each polyimide layer is fixed to the post. A reason for providing the posts, not providing a metal block under the metal pad instead of the multi-polyimide layers, is that because of large thickness of the multi-polyimide layers, if the space for the multi-polyimide layers is filled with the metal block, it would make a large technical trouble due to large difference in between stresses of metal and polyimide and large costs for fabricating the metal block.

According to the second structure, the above objects are accomplished by providing holes passing through the metal pad and the multi-polyimide layers, for setting free the water lurking in the multi-polyimide layers under the metal pad, every after curing or post-baking the MCS. Setting free the water thus, the polyimide layers become hard to be separated each other.

According to the third structure, the above objects are accomplished by placing no polyimide layer under the metal pad, by fabricating the metal pad substantially directly on the base substrate of the MCS.

PREFERRED EMBODIMENT OF THE INVENTION

Figure 1:
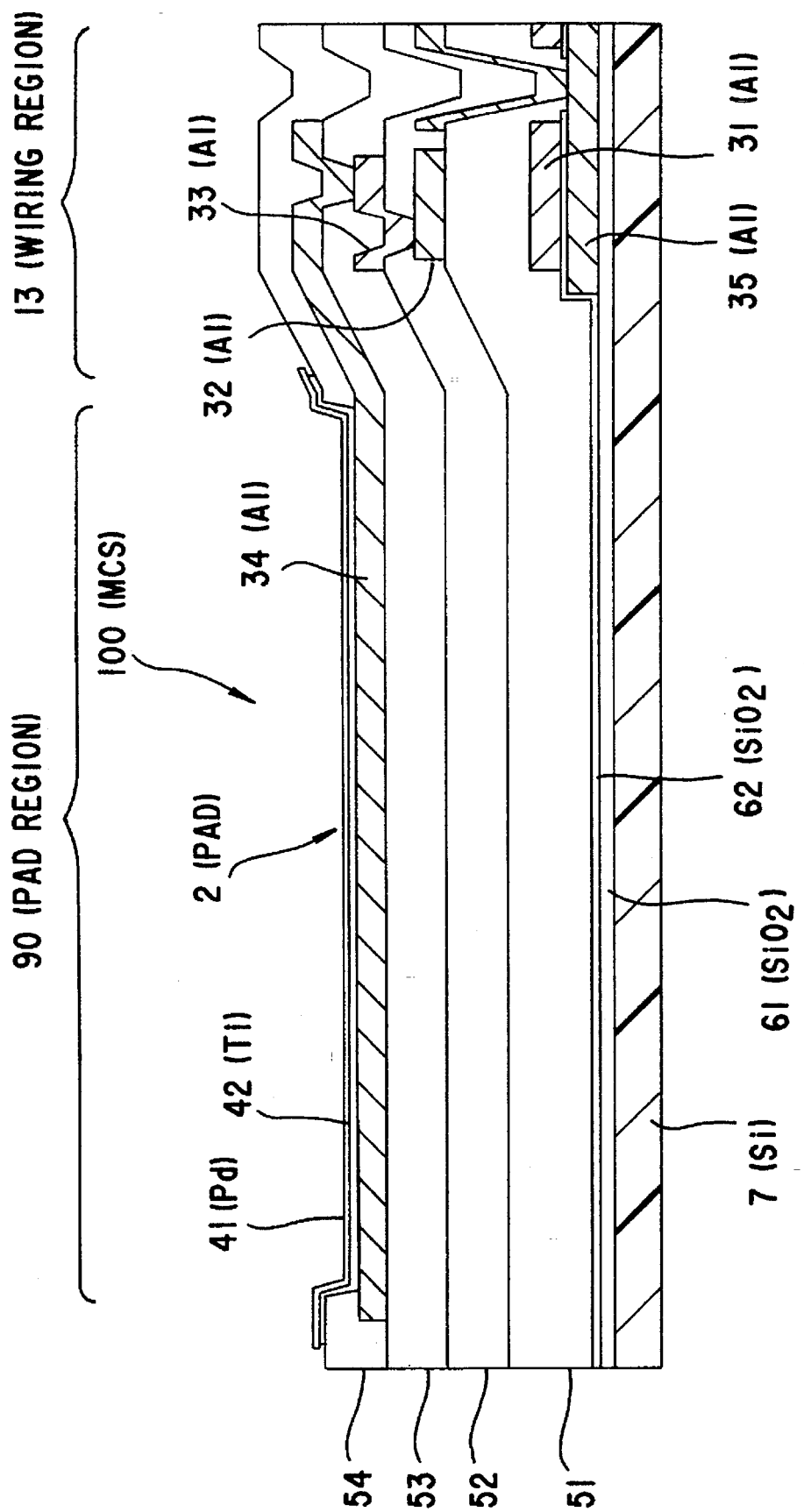
FIG. 1 is a cross sectional view of a metal pad and layers lying under the pad of a prior art MCS.
Figure 2A:
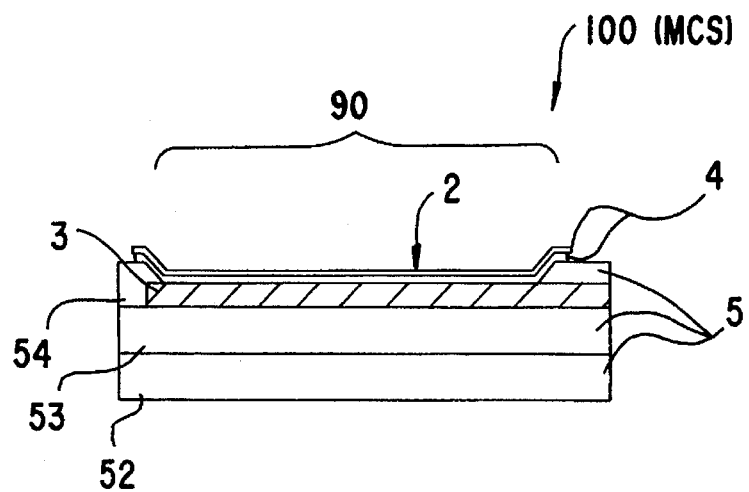
FIG. 2A is a schematic partially cross sectional view of the metal pad and layers lying under the pad of the prior art MCS, before bonding.
Figure 2B:
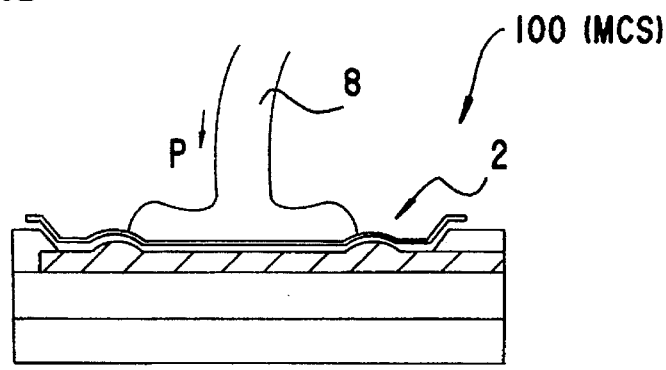
FIG. 2B is the same cross sectional view as in FIG. 2A, under pushing the metal pad for bonding.
Figure 2C:
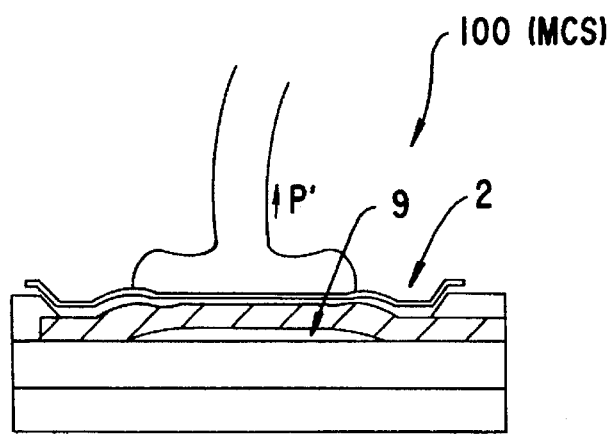
FIG. 2C is the same cross sectional view as in FIG. 2A, after pulling the the metal pad for ascertaining sufficient bonding.
Figure 3A:
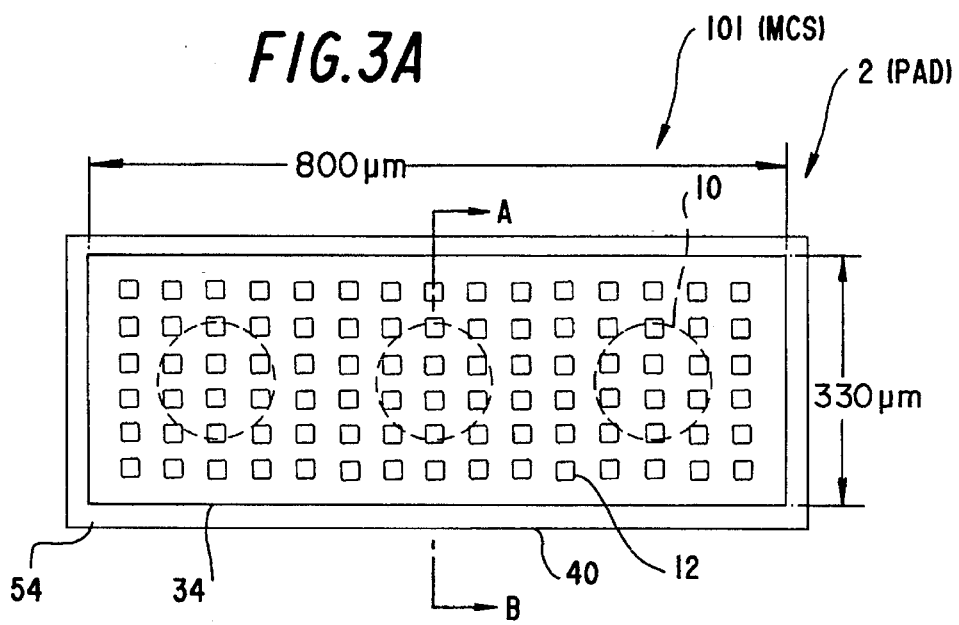
FIG. 3A is a schematic plan view of a metal pad of an MCS for the first embodiment of the present invention.
Figure 3B:
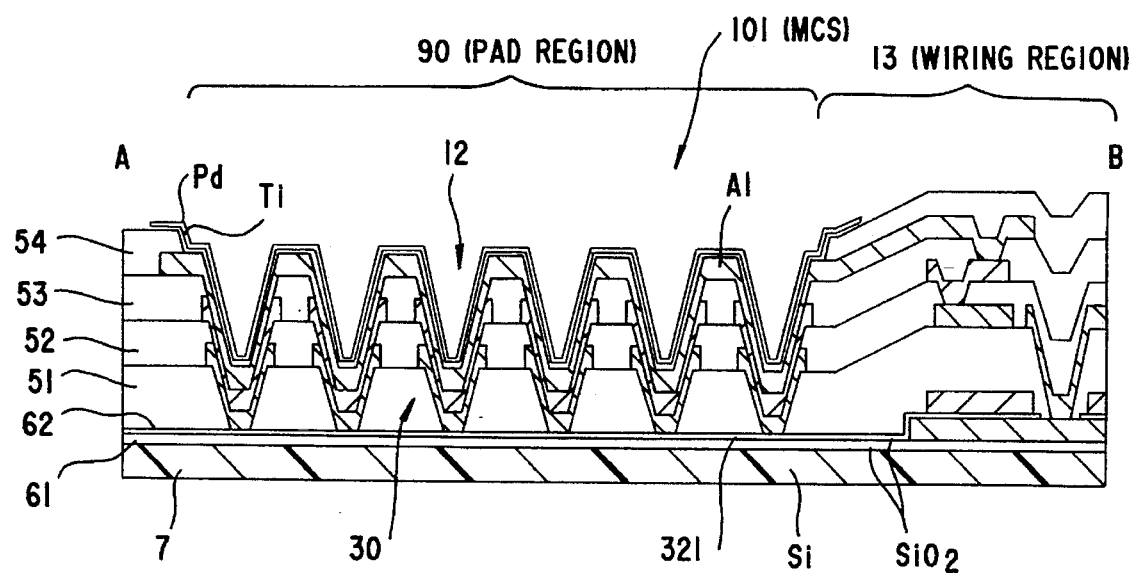
FIG. 3B is an enlarged cross sectional view taken on line A-B of FIG. 3A.

FIG. 3A is a schematic plan view around the PAD 2 of an MCS (101) for a first embodiment of the present invention and FIG. 3B is an enlarged partial cross sectional view of the MCS 101 taken on line A-B of FIG. 3A. In FIGS. 3A and 3B, the same reference numerals as in FIG. 1 designate the same parts as in FIG. 1.

As shown in FIG. 3B, the point of the first embodiment is that a plurality of posts (30) made of the same material (aluminum) as that used to the wiring layers 31, 32, 33, 34 and 35 are provided between the PAD 2 and the $SiO_2$ insulation layers 62 fabricated on the Si base substrate 7 through the $SiO_2$ insulation layers 61, passing through the polyimide layers 53, 52 and 51. Each post 30 has an uneven frictional surface such as a steps configuration surface for tightly fixing the polyimide layers 51, 52 and 53 to the post 30. By virtue of providing the posts 30 between the PAD 2 and the Si base substrate 7, no separation in between the PAD 2 and the polyimide layer 53, among the polyimide layers 51, 52 and 53 and between the polyimide layers 51 and the Si base substrate 7 when the pushing and pulling force is added to the PAD 2 in the bonding process.

FIG. 3A illustrates the arrangement of via holes filled with the posts 30 on the PAD 2. In FIG. 3A, the PAD 2 has a dimension of, for example, 800 micrometer(μm)×330 μm, and bonding wires made of, for example, gold are bonded at bonding regions (10) provided in the pad region 90 as depicted by dotted circles in FIG. 3A.

Figure 4A:
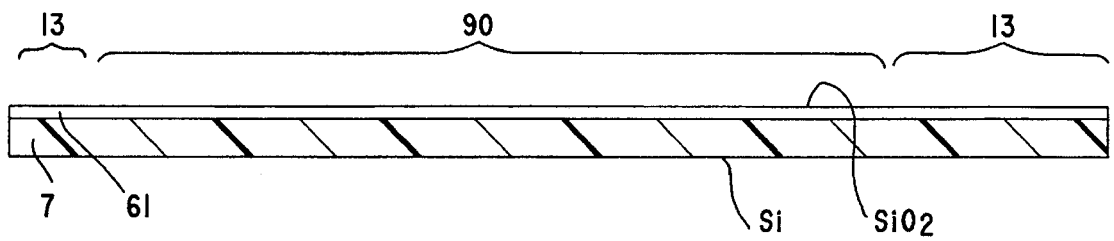
FIG. 4A is a cross sectional view for illustrating the first step of the fabrication of the metal pad and layers under the pad of the MCS for the first embodiment.
Figure 4B:
FIG. 4B is a cross sectional view for illustrating the second step of the same fabrication as in FIG. 4A.
Figure 4C:
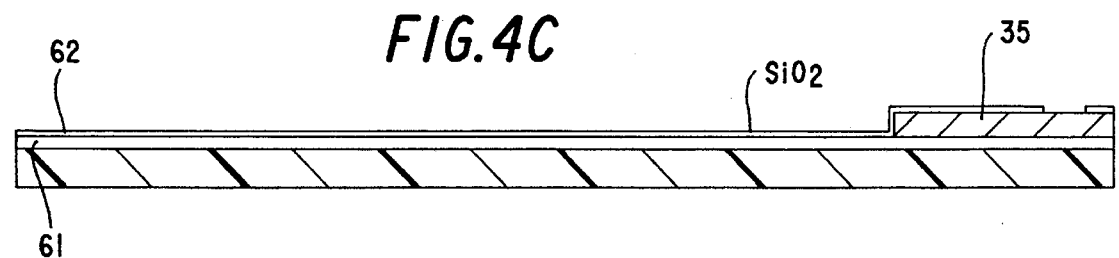
FIG. 4C is a cross sectional view for illustrating the third step of the same fabrication as in FIG. 4A.

The fabrication process of the MCS 101 will be described in order of the steps and in reference to partial cross sectional views of FIGS. 4A, 4B, 4C, - - - , 4K and 4L, corresponding to the steps respectively. In FIGS. 4A, 4B, 4C, - - - , 4K and 4L, the same reference numerals as in FIG. 3B designate the same parts as in FIG. 3B.

(1) The $SiO_2$ insulation layer 61 is fabricated so as to have 300 nanometers (nm) thickness, on the Si base substrate 7 having 600 μm thickness, as shown in FIG. 4A.

(2) The wiring layer 35 having 3 μm thickness is fabricated on the $SiO_2$ insulation layer 61 in the wiring region 13, by well known sputtering and patterning technique, as shown in FIG. 4B.

(3) The $SiO_2$ insulation layer 62 having 100 nm thickness is fabricated on both the $SiO_2$ insulation layer 61 and the wiring layer 35 by well known CVD technique, as shown in FIG. 4C.

Figure 4D:
FIG. 4D is a cross sectional view for illustrating the fourth step of the same fabrication as in FIG. 4A.

(4) The wiring layer 31 having 3 μm thickness is fabricated on the $SiO_2$ insulation layer 62 in the wiring region 13 by the sputtering and patterning technique, as shown in FIG. 4D.

Figure 4E:
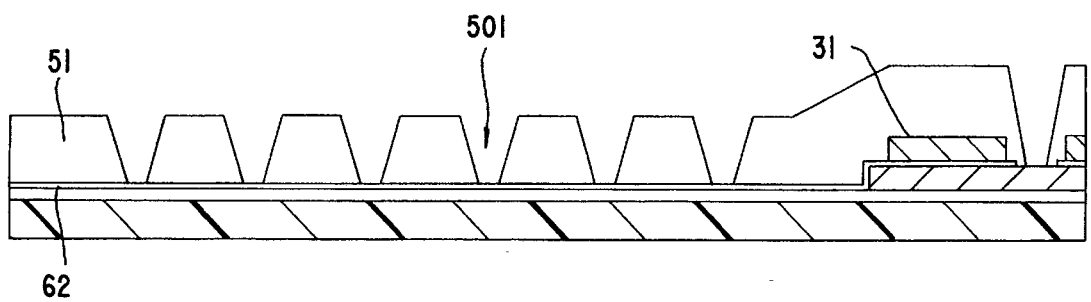
FIG. 4E is a cross sectional view for illustrating the fifth step of the same fabrication as in FIG. 4A.

(5) The polyimide layer 51 having 10 μm thickness is fabricated on the $SiO_2$ insulation layer 62 in the pad region 90 and on the wiring layer 31 in the wiring region 13 by: firstly coating the optically sensitive predecessor of polyimide over the $SiO_2$ insulation layer 62 and the wiring layer 31 in 20 μm thickness, by well known spin-coating technique; secondly, in the pad region 90, fabricating via holes 501 for fabricating the metal posts 30 to the predecessor by patterning technique; thirdly, pre-baking the patterned predecessor at 160° C. for 30 minutes; and lastly, curing the pre-baked predecessor of polyimide at 350° C. for 3 hours, as shown in FIG. 4E.

Figure 4F:
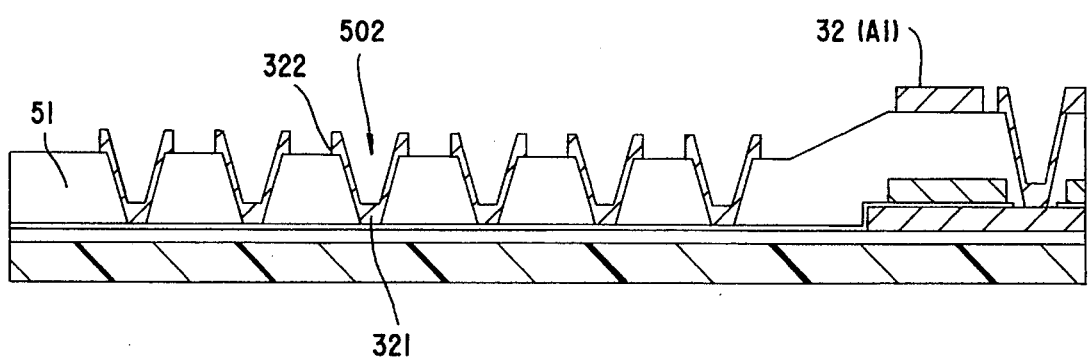
FIG. 4F is a cross sectional view for illustrating the sixth step of the same fabrication as in FIG. 4A.

(6) A metal layer made of aluminum and having 3 μm thickness is fabricated on the polyimide layer 51 by sputtering, and wiring layer 32 and metal layers 321 for filling the via holes 501 are formed by patterning, providing via holes 502 so that an edge part 322 of each metal layer 321 covers the upper surface of the polyimide layer 51 partially, as shown in FIG. 4F.

Figure 4G:
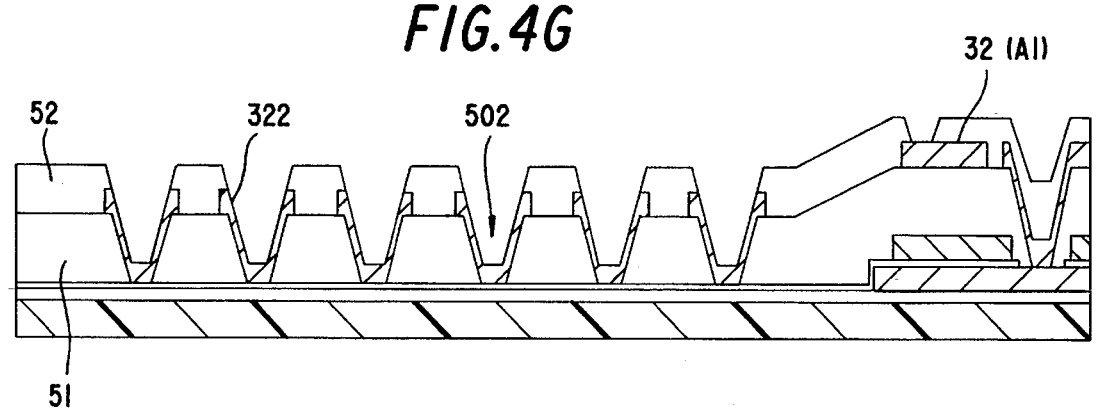
FIG. 4G is a cross sectional view for illustrating the seventh step of the same fabrication as in FIG. 4A.

(7) The polyimide layer 52 having 5 μm thickness is fabricated on the polyimide layer 51, the edge 322 and the wiring layer 32 as shown in FIG. 4G, by the same step as described in step (5) except that the thickness of the predecessor is 10 μm and via holes 502 are left as it is fabricated in step (6).

Figure 4H:
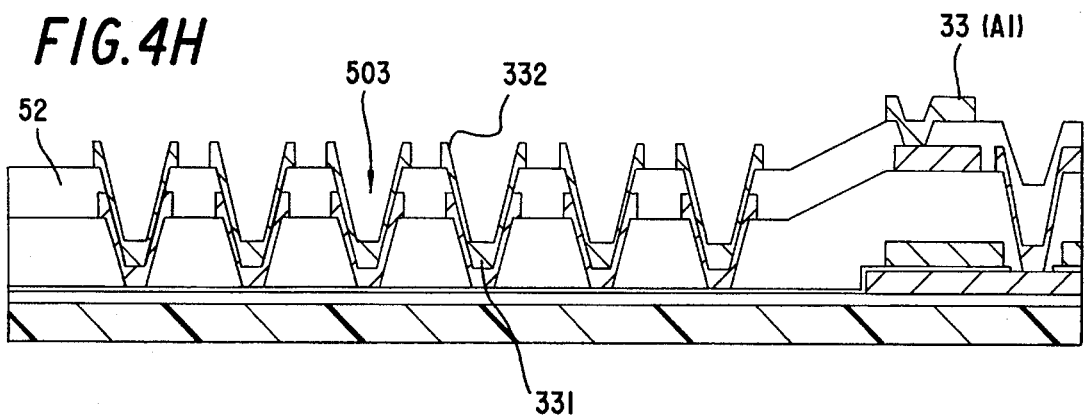
FIG. 4H is a cross sectional view for illustrating the eighth step of the same fabrication as in FIG. 4A.

(8) The same as described in step (6), a metal layer made of aluminum and having 3 μm thickness is fabricated on the polyimide layer 52 by sputtering, and the wiring layer 33 and metal layers 331 for filling the via holes 502 are formed by patterning, providing via hole 503 so that an edge part 332 of each metal layer 331 covers the upper surface of the polyimide layer 52 partially, as shown in FIG. 4H.

Figure 4I:
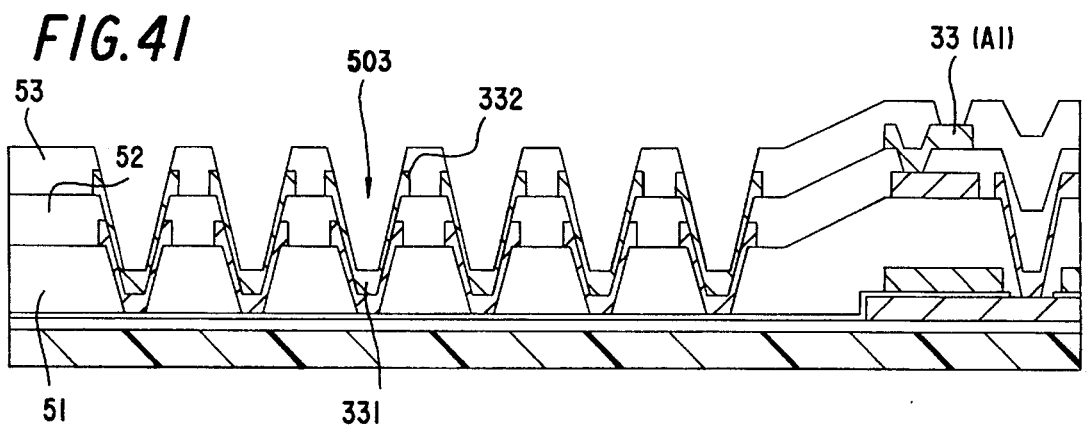
FIG. 4I is a cross sectional view for illustrating the ninth step of the same fabrication as in FIG. 4A.

(9) The same as described in step (7), the polyimide layer 53 having 5 μm thickness is fabricated on the polyimide layer 52, the edge 332 of each metal layer 331 and the wiring layer 33, leaving the via hole 503 as it is fabricated in step (8), as shown in FIG. 4I.

Figure 4J:
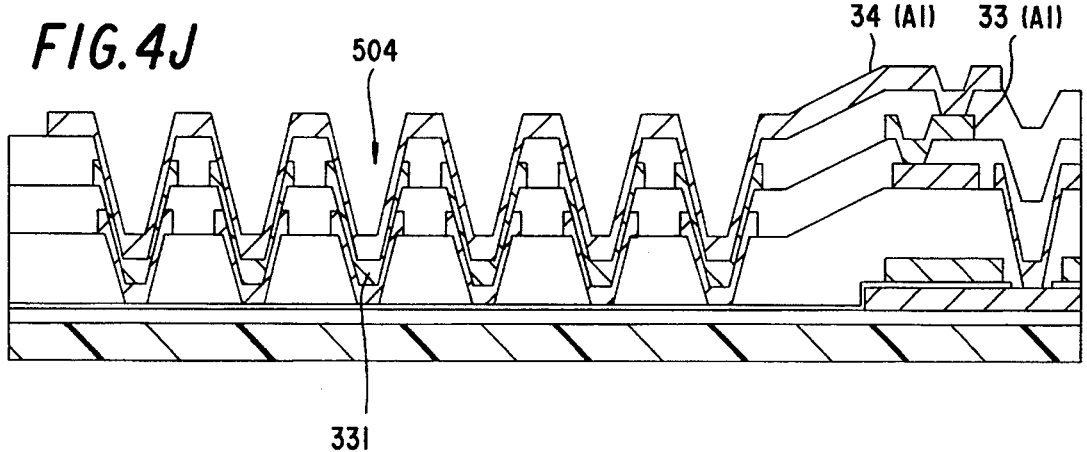
FIG. 4J is a cross sectional view for illustrating the tenth step of the same fabrication as in FIG. 4A.

(10) The wiring layer 34 is fabricated on the polyimide layer 53 and the via hole 503 of the metal layer 331 in the pad region 90, forming a pad pattern having via holes 504 in the pad region 90, as shown in FIG. 4J. Further more, the wiring layer 34 is fabricated on the polyimide layer 53 and a via hole to be used for the wiring layer 33 in the wiring region 13, as shown in FIG. 4J.

Figure 4K:
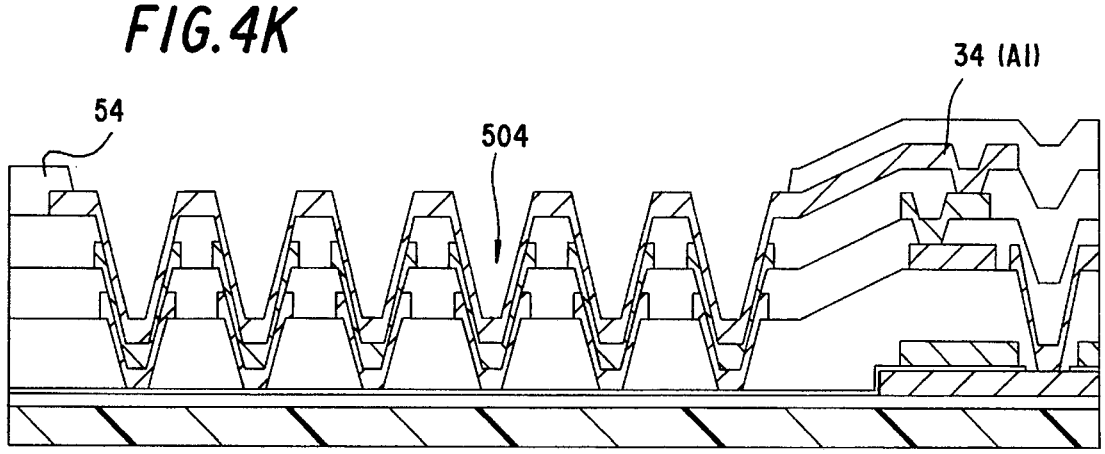
FIG. 4K is a cross sectional view for illustrating the eleventh step of the same fabrication as in FIG. 4A.

(11) The polyimide layer 54 having 5 μm thickness is fabricated on the wiring layer 34 in the wiring region 13 as shown in FIG. 4K, by the same process as described in step (7) or (9).

Figure 4L:
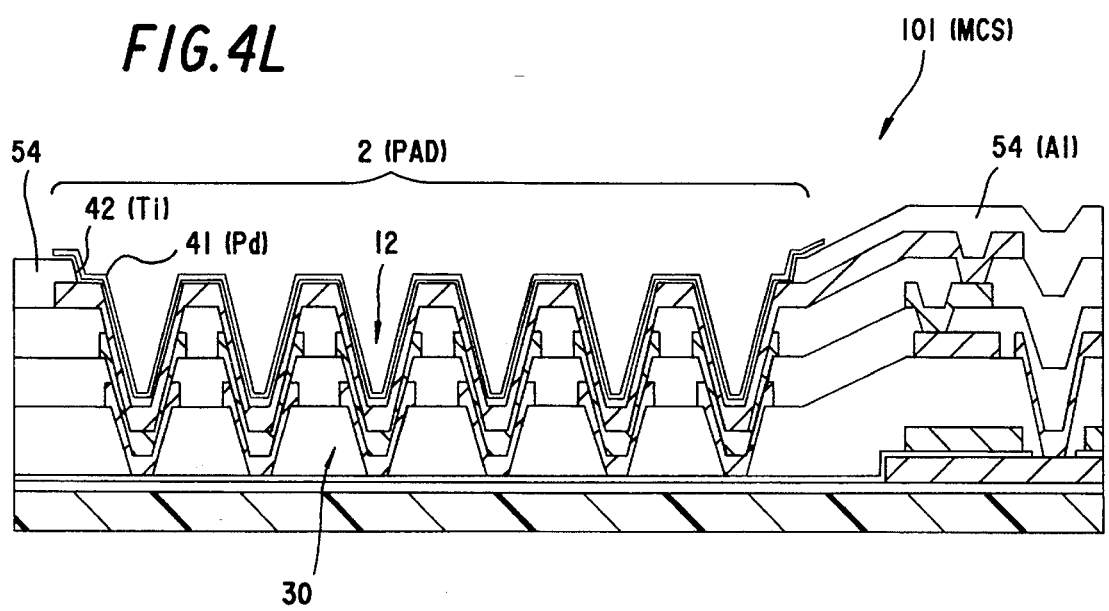
FIG. 4L is a cross sectional view for illustrating the twelfth step of the same fabrication as in FIG. 4A.

(12) Lastly, the protection layer 40 consisting of the Ti Film 42 having 500 nm thickness and the Pd film 41 having 300 nm thickness are fabricated on the wiring layer 34, forming via holes 12, in the pad region 90 as shown in FIG. 4L. Further more, the protection layer 40 is fabricated on an edge part, which faces the pad region 90, of the polyimide layer 54 as shown in FIG. 4L. The fabrication of the protection layer 40 is carried out by sputtering and patterning technique. The Pd and Ti films 41 and 42 are for protecting surface of the pad pattern of the wiring layer 34 from being damaged in the bonding process.

In the above description of the fabricating process of the MCS 101, dimensions of openings of the via holes 501, 502 and 503 in FIGS. 4E, 4F and 4H are 10 μm, 12 μm, and 14 μm square respectively, and the polyimide layer 54 in FIG. 4K is opened as much as 770 μm×300 μm in dimension, for the pad pattern.

Figure 5:
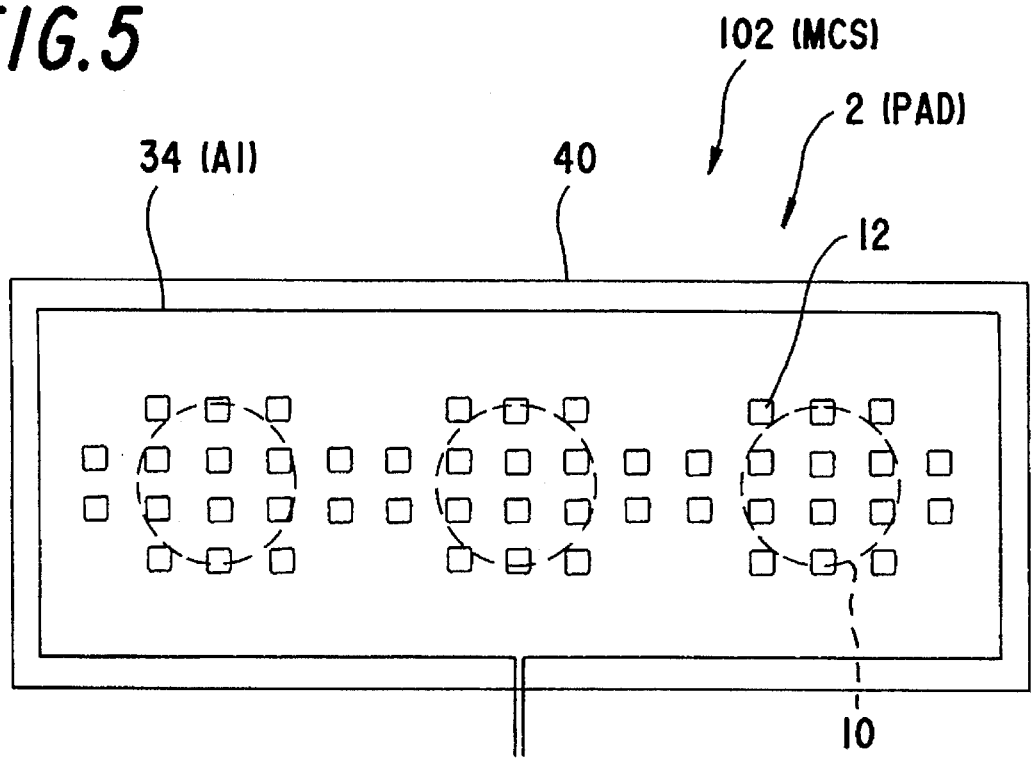
FIG. 5 is a schematic plan view of a metal pad of an MCS for the second embodiment of the present invention.

FIG. 5 is a schematic partial plan view around a metal pad of an MCS 102 for a second embodiment of the present invention. In FIG. 5, the same reference numerals as in FIG. 3A designate the same parts as in FIG. 3A. Different from the first embodiment, in the second embodiment in FIG. 5, via holes 12 filled with the posts 30 are only arranged around the bonding regions 10. The pushing and pulling force added to the metal pad in bonding is concentrated to the bonding regions 10. FIG. 5 teaches that the polyimide layers 51, 52 and 53 should be reinforced at least around the bonding regions 10.

Figure 6:
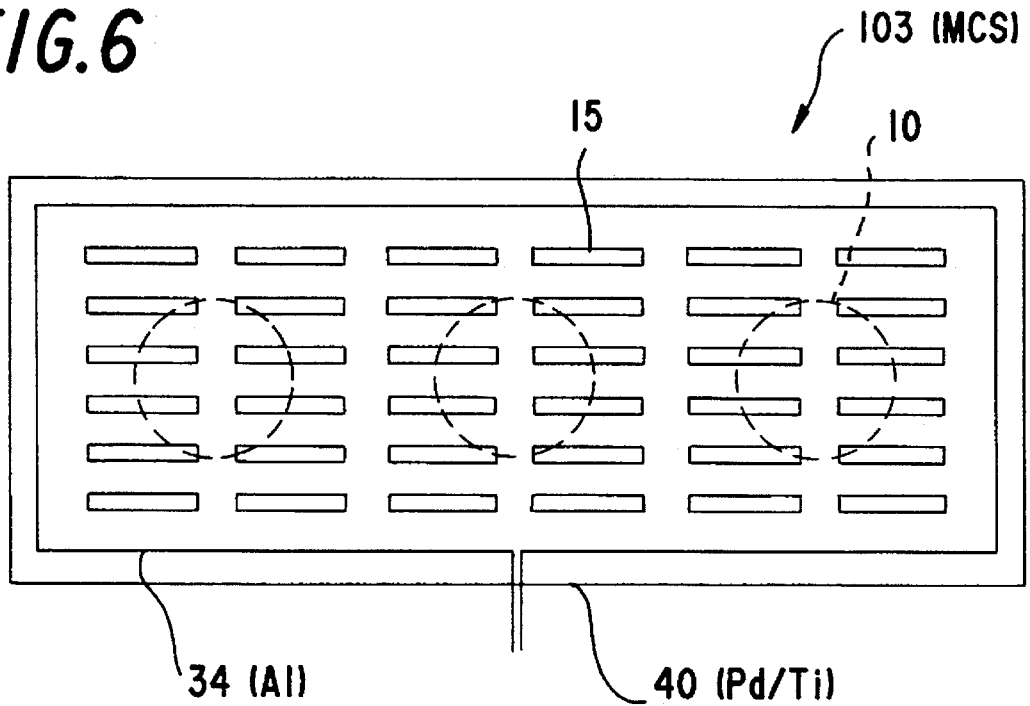
FIG. 6 is a schematic plan view of a metal pad of an MCS for the third embodiment of the present invention.

FIG. 6 is a schematic partial plan view around a metal pad of an MCS 103 for a third embodiment of the present invention. In FIG. 6, the same reference numeral as in FIG. 3A designates the same part as in FIG. 3A. The third embodiment is obtained by modifying the first embodiment described in reference to FIGS. 3A and 3B or FIGS. 4A to 4L. In the third embodiment, a plurality of open holes 15 are provided in the pad region 90, passing through the protection layer consisting of the Pd layer 41 and the Ti layer 42 and the wiring layer 34 connected with the protection layer, so that a part of the polyimide layer 53 can be seen from the top of the MCS 103. Providing the open holes 15 thus, the water oozed out from the polyimide layers 53, 52 and 51 accumulated under PAD 2 can be set free to the outside of the MCS 103. In particular, the open holes 15 are arranged so as to extend over a border line of each bonding region 10. This is for setting free the oozed water even though the bonded wires cover the bonding region 10. If the oozed water can be easily set free to outside of the MCS 103 without interruption due to the wiring layers in the multi-polyimide layers, the open holes 15 can be arranged at any place on the upper surface of the MCS 103.

Figure 7A:
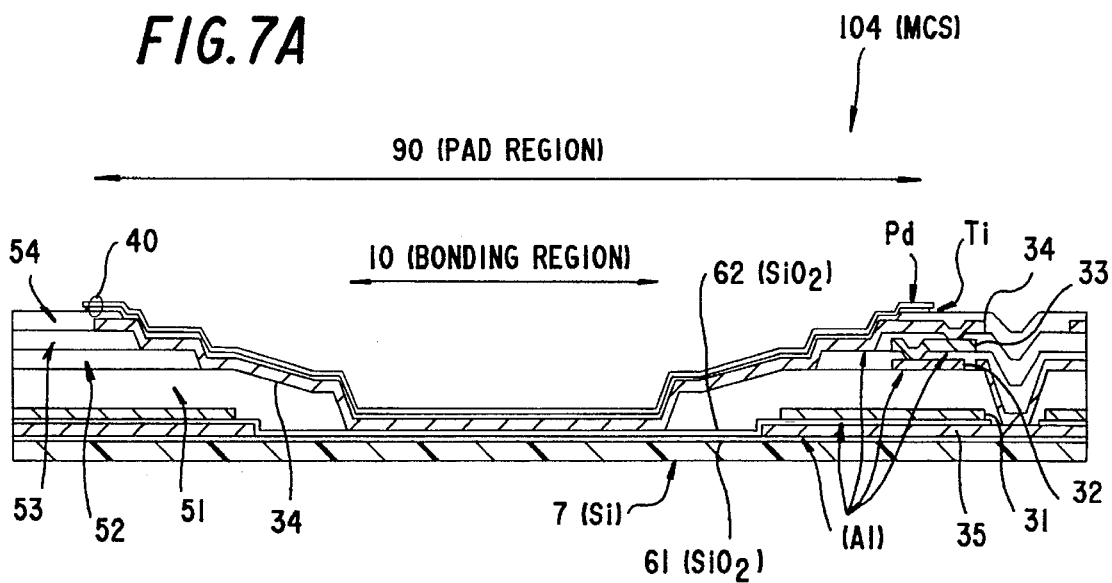
FIG. 7A is a cross sectional view of a metal pad and layers lying under the pad of an MCS for the fourth embodiment of the present invention.
Figure 7B:
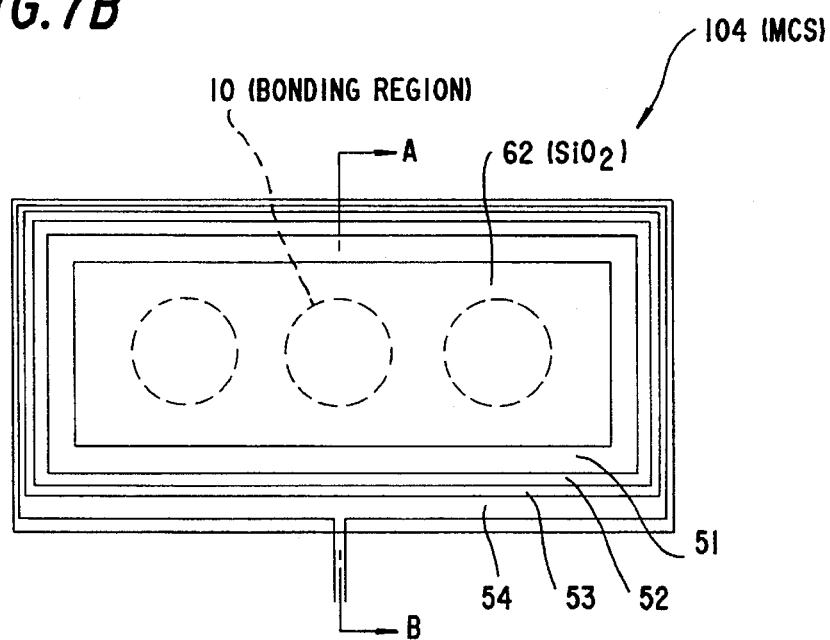
FIG. 7B is a schematic cross sectional view of the metal pad in FIG. 7A.

FIG. 7A is a partial cross sectional view around a metal pad of an MCS 104 for a fourth embodiment of the present invention. In FIG. 7A, the same reference numerals as in FIG. 3A designate the same parts as in FIG. 3A. In the fourth embodiment in FIG. 5, the MCS 104 is fabricated so that no polyimide layer is in the bonding region 10 and the wiring layer 34 lying in the bonding region 10 directly sticks to the $SiO_2$ insulation layers 61 and 62 fabricated on the Si base substrate 7. Therefore, the metal post or the open hole is not necessary to be provided. Further, the fourth embodiment has a feature that the polyimide layers 51, 52, 53 and 54 are fabricated so as to be gradually terraced at the periphery of the bonding region 10. By virtue of the terrace structure, the fabrication process such as photoresist coating and layer patterning can be performed without trouble due to steep steps of the layers. FIG. 7B is a schematic plan view of the MCS 104 in FIG. 7A. In FIG. 7B, the wiring layer 34 and the protection layer 40 are removed for showing the terraced structure of the polyimide layers 51, 52, 53 and 54. Wherein, FIG. 7A is an enlarged partial view of the MCS 104 taken on line A-B of FIG. 7B.

What is claimed is:

1. A multichip substrate for mounting integrated circuit semiconductor chips, said multichip substrate comprising:

a base substrate a first insulation layer fabricated on said base substrate;

multi-insulation layers accumulated on said first insulation layer;

multi-wiring layers made of an electrically conductive substance, accumulated on said first insulation layer, interposing said multi-insulation layers into said multi-wiring layers for keeping said multi-wiring layers apart;

a bonding pad for external electrical connection of multi chip substrate made of an electrically conductive substance, lying above said multi-insulation layers and said multi-wiring layers and electrically connected with said multi-wiring layers through said multi-insulation layers; and standing structures made by accumulating first substance layers so as to stand between said bonding pad and said first insulation layer in at least a bonding region of said bonding pad and under said bonding pad, passing through said multi-insulation layers, so as to stick to said first insulation layer, said bonding region being a region in which wire bonding is carried out.

2. A multichip substrate according to claim 1, wherein said multi-insulation layers are made of polyimide.

3. A multichip substrate according to claim 1, wherein the first substance layers of said standing structures belong to said multi-wiring layers respectively.

4. A multichip substrate according to claim 1, wherein said standing structure has a more frictional surface compared to said multi-insulation layers surrounding said standing structure.

5. A multichip substrate according to claim 4, wherein the frictional surface of said standing structure is a surface having a stepped configuration.

6. A multichip substrate according to claim 1, wherein said bonding pad has opening holes fabricated so as to expose one of said multi-wiring layers lying beneath said the bonding pad.

7. A multichip substrate according to claim 6, wherein the opening holes are distributed beyond the bonding region.

8. A multichip substrate according to claim 6, wherein each of the opening holes is over the bonding region.

9. A multichip substrate for mounting integrated circuit semiconductor chips, said multichip substrate comprising:

a base substrate a first insulation layer fabricated on said base substrate;

multi-insulation layers accumulated on said first insulation layer;

multi-wiring layers made of an electrically conductive substance, accumulated on said first insulation layer, interposing said multi-insulation layers into said multi-wiring layers for keeping said multi-wiring layers apart; and a bonding pad for external electrical connection of said multichip substrate made of an electrically conductive substance and lying above said multi-insulation layers and said multi-wiring layers and electrically connected with said multi-wiring layers through said multi-insulation layers, said bonding pad being fabricated directly on said first insulation layer.

10. A multichip substrate according to claim 9, wherein said multi-insulation layers are made of polyimide.

11. A multichip substrate according to claim 9, wherein said multi-insulation layers are fabricated in terraced configuration at a periphery of said bonding pad.

* * * * *